United States Patent [19]

Bouwhuis et al.

[11] 4,251,160

[45] Feb. 17, 1981

[54] METHOD AND ARRANGEMENT FOR ALIGNING A MASK PATTERN RELATIVE TO A SEMICONDUCTOR SUBSTRATE

[75] Inventors: Gijsbertus Bouwhuis; Theodorus F. Lamboo, both of Eindhoven, Netherlands

[73] Assignee: U.S. Philips Corporation, New York, N.Y.

[21] Appl. No.: 924,351

[22] Filed: Jul. 13, 1978

Related U.S. Application Data

[63] Continuation of Ser. No. 742,210, Nov. 16, 1976, abandoned.

[30] Foreign Application Priority Data

Jun. 17, 1976 [NL] Netherlands ......................... 7606548

[51] Int. Cl.² ............................................. G01B 11/26
[52] U.S. Cl. .................................... 356/401; 356/150
[58] Field of Search ................ 356/138, 150, 400, 401

[56] References Cited

U.S. PATENT DOCUMENTS

| | | | |
|---|---|---|---|
| 3,695,758 | 10/1972 | Tanaka | 350/81 |
| 3,739,247 | 6/1973 | Yamaguchi et al. | 356/400 |
| 3,751,170 | 8/1973 | Hidaka | 356/401 |
| 3,811,779 | 5/1974 | Jacobs et al. | 356/400 |

*Primary Examiner*—John K. Corbin
*Assistant Examiner*—R. A. Rosenberger
*Attorney, Agent, or Firm*—Thomas A. Briody; Paul R. Miller

[57] ABSTRACT

A method and arrangement for aligning a mask comprising a mask-pattern relative to a substrate when the mask-pattern is repeatedly and directly imaged on the substrate, gratings in the mask and gratings on the substrate (phase gratings) being employed as alignment references. The gratings in the mask are located outside the mask pattern and the phase gratings are located on the substrate outside the area where the mask-pattern is imaged. The substrate (phase) gratings are imaged on one of the mask gratings with a projection system which is also used for projecting the mask-pattern on the substrate. The image of the gratings on the grating in the mask is adjusted. Thus, a very accurate alignment can be achieved.

10 Claims, 12 Drawing Figures

METHOD AND ARRANGEMENT FOR ALIGNING A MASK PATTERN RELATIVE TO A SEMICONDUCTOR SUBSTRATE

This is a continuation of application Ser. No. 742,210, filed Nov. 16, 1976 now abandoned.

The invention relates to a method of aligning a mask pattern formed in a mask relative to a substrate when the mask pattern is repeatedly imaged directly on the substrate, gratings on the substrate and in the mask being used as alignment references. The invention also relates to an arrangement for carrying out this method.

Nowadays use is made of diffusion techniques and associated masking techniques for the fabrication of integrated circuits (I.C.'s). A multiplicity of masks with different configurations are then consecutively imaged at the same location of the substrate. Between the successive imagings at the same location the substrate is subjected to the desired physical and chemical changes. Thus, a passive and/or active element is obtained which is known by the name of integrated circuit.

Diffusion and masking techniques are also employed in the fabrication of so-called magnetic domain memories (bubble memories) for the formation of transport patterns and detection patterns on a magnetizable layer which is provided on a substrate. Also in this case the accurate alignment of the mask patterns to be used in the consecutive process steps presents a problem. This problem is so serious that attempts are made (compare I.E.E.E. Transactions on Magnetics, Vol. Mag. 9, No. 3, Sept. 1973, pages 474-480) to use only one pattern on the layer of magnetizable material, which pattern serves both for the transport and for the detection of the magnetic domains. However, as the requirements imposed on a transport pattern differ from those imposed on a detection pattern, a compromise is to be made with respect to the thickness of the pattern on the magnetizable material and the properties of the material of the pattern.

The accuracy with which integrated circuits are manufactured has to satisfy increasingly exacting requirements. This requires that the location at which successive masks are to be imaged on the substrate should be defined with ever increasing accuracy. Deviations greater than for example 1 micron may be prohibitive.

In the U.S. Pat. No. 3,811,779, issued May 21, 1974, and assigned to the present assignee, an arrangement is described for aligning a composite mask which comprises a multitude of identical I.C. Patterns, with respect to a semiconductor substrate. This composite mask can be manufactured as follows:

First of all the relevant I.C. pattern is drawn to an enlarged scale with the aid of a machine which is for example computer-controlled. Subsequently, the I.C. Pattern thus obtained is optically reduced. The pattern thus obtained is then further optically reduced with a so-called repeater camera and repeatedly imaged at different locations on a photographic plate, so that a composite mask with I.C. patterns of the desired size are obtained. This composite mask can be projected at once on a semiconductor substrate.

An arrangement has been developed for the formation of a plurality of patterns on a substrate, the substrate itself being repeatedly exposed to an image, which may be reduced, of one pattern. For the fabrication of, for example integrated circuits a composite mask is then no longer required and the use of a photorepeater camera is no longer necessary. Whereas in the arrangement in accordance with the U.S. Pat. No. 3,811,779 a so-called contact copy of the composite mask is formed on the substrate, the arrangement projects an image of the I.C. pattern onto the substrate. In the last mentioned arrangement the I.C. pattern can be imaged onto the substrate in reduced form (for example 5×), so that a reducing step may be dispensed with when making the mask. However, it is also possible that a 1 to 1 image of the I.C. pattern is formed on the substrate.

A general advantage of projection is that during projection no wear of the mask occurs. As a result, the mask has to be checked only once, instead of several times. Furthermore, accurate alignment of the mask during projection can be effected more quickly. This is because when a contact copy is made the mask and the substrate must still be moved towards one another after the mask and the substrate have been aligned with respect to each other. This may then lead to the substrate being shifted relative to the mask in a direction parallel to the plane of the mask or of the substrate. In that case either realignment is necessary or a less accurate alignment must be accepted.

As the mask to be used in the arrangement developed by the Applicant comprises only one I.C. pattern, inspection of the mask is simple. This inspection is even further simplified if the I.C. pattern is to be imaged in reduced form, so that the details of the I.C. pattern in the mask are correspondingly large.

The present invention relates to the method in which and the means with which the mask pattern is aligned relative to the substrate in the arrangement developed by the Applicant. The method according to the invention is characterized in that two phase gratings which are located outside the area on the substrate where a plurality of images of the mask pattern is to be formed, are imaged on a first of two gratings which are located in the mask outside the mask pattern, with the aid of a projection system which is used for imaging the mask pattern on the substrate, and that the position of the observed image of a grating, which is being aligned relative to the first grating in the mask, is modulated.

The method of alignment described in the U.S. Pat. No. 3,811,779 differs from the method in accordance with the invention inter alia in that the first mentioned method the individual gratings of the substrate and the mask are aligned relative to a reference grating which is disposed on a separate support. Moreover, the position of an image of grating is not modulated in the arrangement in accordance with the previous Patent.

It is to be noted that, when projecting I.C. patterns onto a semiconductor substrate, it is known per se from U.S. Pat. No. 3,695,758 to pass the alignment beam of radiation and the radiation beam with which the I.C. pattern is imaged on the substrate through the same projection system. However, this patent does not describe the alignment procedure. It is not clear whether gratings are used for the alignment and there is absolutely no indication where the phase gratings, if any, would have to be located on the substrate. Furthermore, it is not known from such U.S. Pat. No. 3,695,758 to modulate the position of an image of a grating. Finally, the alignment beam and the projection beam in the known arrangement traverse a semi-transparent mirror on their way to the substrate, so that the radiation intensity of the beams is halved, which is a drawback, in particular for the projection of the I.C. pattern onto the substrate.

A preferred embodiment of a method in accordance with the invention is characterized in that first of all, by rotation about an axis perpendicular to the plane of the mask, the lines of an image of the second grating in the mask, which lines extend in a first direction, are aligned relative to the corresponding lines of the first grating in the mask, that subsequently the grating lines of a first of the two substrate gratings, which lines extend in two mutually perpendicular directions, are aligned relative to the corresponding grating lines of the first greating in the mask, that after this the substrate is moved in the direction of the line which connects the centers of the first and the second mutually aligned gratings in the mask over a distance equal to the distance between the two substrate gratings, and that finally, by rotation about an axis which extends substantially through the center of the first substrate grating, the grating lines of the second substrate grating are aligned relative to the corresponding grating lines of the first grating in the mask.

An arrangement for carrying out the method preferably comprises a radiation source which supplies an alignment beam, a lens system for each time imaging one of the substrate gratings on a first grating in the mask, and a radiation sensitive detector which is disposed in the path of the alignment beam behind the mask. The lens system includes the projection system utilized for imaging the mask pattern on the substrate, and, in the path of the alignment beam between the system of projection lenses and the detector, optical elements are included which are controlled by periodic signals for periodically moving the image of a grating observed by the detector and formed in the plane of the mask, the displacement of the observed image being of the order of magnitude of the period of the first grating in the mask.

A preferred embodiment of an apparatus in accordance with the invention is furthermore characterised in that in the path of the alignment beam between the projection system and the mask a diaphragm is included which only transmits the first-order sub-beams of the alignment beam diffracted by the substrate gratings to the mask. The alignment accuracy for a specific period a substrate grating in the case that only the first-order beams are employed, is two times higher than in the case that the zero-order beam were also used.

In order to prevent magnification errors in imaging the substrate gratings on the first greating of the mask, owing to flatness errors of the substrate or the mask, or owing to the plane of the substrate or the mask not being perpendicular to the optical axis of the system of projection lenses, an arrangement in accordance with the invention is further characterized in that the projection system is a telecentric system and comprises three lens systems, of which the system which is nearest the substrate is movable along the optical axis, while the two other lens systems along the optical axis are immovable.

In order to enable the angular position of the mask itself to be adjusted before the substrate is aligned relative to the mask, an arrangement in accordance with the invention is characterized by the following. In addition to a first radiation path for each time imaging one of the substrate gratings on the first grating in the mask, which radiation path extends from the radiation source via a radiation-reflecting element (which may optionally be included in the path of the radiation emitted by the source, via the projection system, a reflection at one of the substrate gratings, a second passage through the projection system, and the diaphragm, to a beam splitter which is disposed underneath the first grating in the mask), a second radiation path is provided for imaging the second grating in the mask onto the first grating in the mask at full true size, the position of the image of the second grating in the mask only depending on the direction of the line which connects the centers of the first and the second grating in the mask relative to the direction of movement of a carriage with which the substrate is moved. The second radiation path extends from the radiation source via reflecting elements above the mask, through the second grating in the mask, and via further reflecting elements underneath the mask, and a lens system to the beam splitter, which beam splitter combines the two radiation paths to a common radiation path through the mask to the radiation sensitive detector.

A preferred embodiment of an arrangement in accordance with the invention, in which the radiation source emits a linearly polarized beam of radiation, is furthermore characterized in that the optical elements for periodically moving the image of each time one of the substrate gratings and the second grating in the mask respectively, are constituted by a polarization-sensitive element which is disposed in the common radiation path before the mask. This element splits the alignment beam into two sub-beams with mutually perpendicular directions of polarization, which sub-beams form images of the second grating in the mask and one of the substrate gratings respectively at the location of the first grating in the mask, which images are mutually shifted by one half period of the first grating in the mask, by a polarization switch which is disposed in the common radiation path before the detector and which is controlled by a squarewave voltage, which switch switches the directions of polarizations of the subbeams through 90°, and by an analyser between the polarization switch and the detector, the control voltage for the polarization switch also being applied to an electronic circuit in which the detector signal is processed to a control signal for correcting the grating position.

Furthermore, it is to be noted that in an embodiment described in the U.S. Pat. No. 3,811,779 two subbeams which are polarized at right angles to each other are employed for the alignment. However, the object of this is merely to enable dynamic detection. These subbeams do not form two shifted images of one substrate grating.

In order to ascertain whether during the alignment of the substrate gratings relative to the first grating in the mask the image of a substrate grating has not shifted a whole number of grating periods relative to the first grating in the mask, an arrangement in accordance with the invention is furthermore characterized in that the common radiation path behind the mask includes a second beam splitter which produces two beams, one of which is aimed at the detector and the second at a camera tube which is coupled with a TV monitor on which the gratings are monitored.

The invention will now be described by way of example with reference to the projection of an I.C. pattern on a semiconductor substrate. For this reference is made to the drawing in which.

Figure 1:
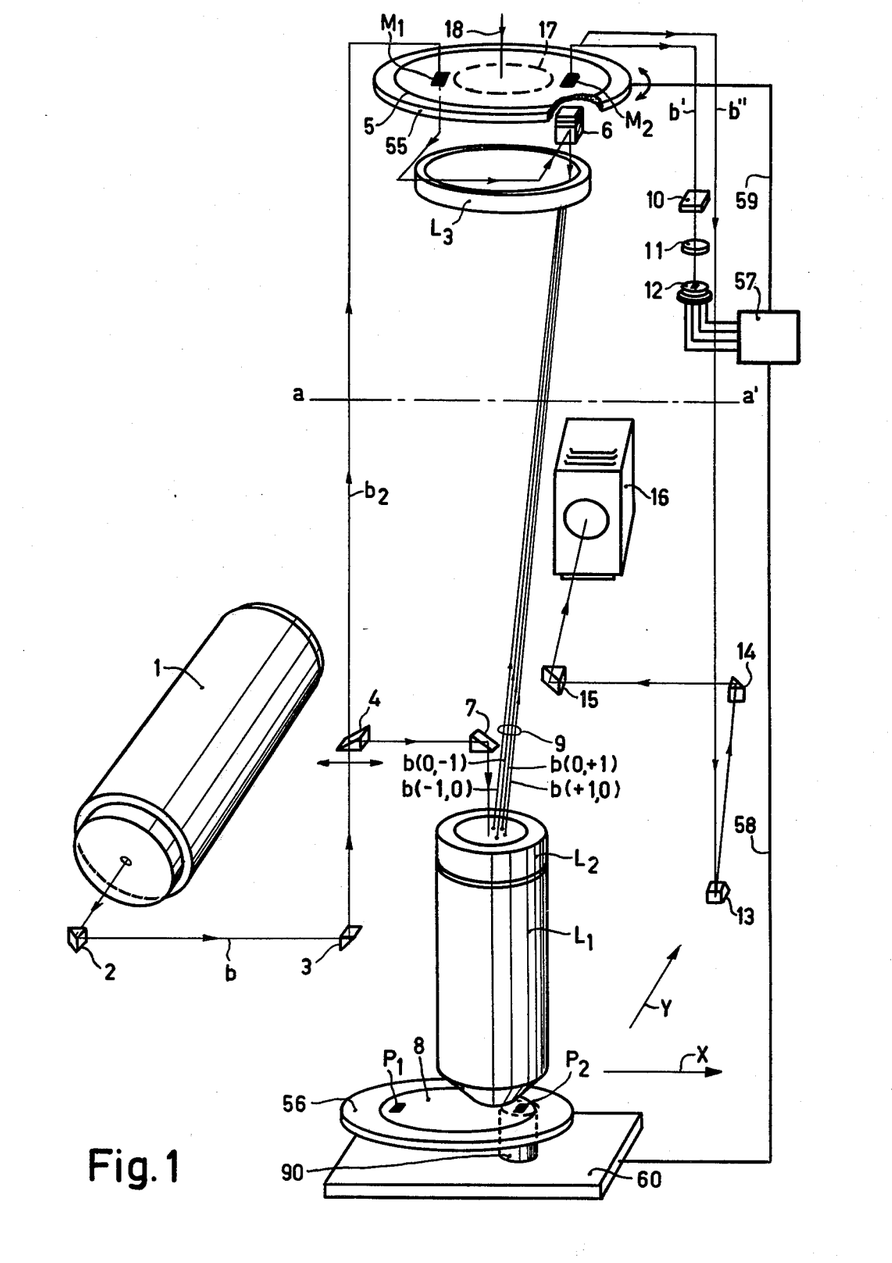
FIGS. 1 and 2 show an embodiment of an arrangement for carrying out the method in accordance with the invention.

In FIG. 1 the reference numeral 5 denotes a mask, which comprises two alignment references $M_1$ and $M_2$ in the form of gratings. Between these alignment references an I.C. pattern 17 is disposed, which is schematically represented by dashes. This pattern is to be imaged a number of times on the semiconductor substrate 8 which also comprises two alignment gratings $P_1$ and $P_2$. The gratings $P_1$ and $P_2$ are disposed outside the area in which a number of images of the I.C. pattern are to be formed. The gratings $M_1$ and $M_2$ take the form of amplitude gratings and the gratings $P_1$ and $P_2$ of phase gratings. Compared with other alignment references such as for example squares in the mask and on the substrate, the periodic gratings have the advantage that when positional errors are measured they are averaged over the grating. Thus accurate alignment is possible, even if one or more grating lines are missing or when the grating lines are serrated lines instead of straight lines. Especially in the fabrication of integrated circuits gratings have the advantage that during the consecutive diffusion processes they cannot grow asymmetrically or become closed, as would be possible when other alignment references such as for example squares were used. In comparison with amplitude gratings phase gratings on the substrate have the advantage that they are etched into the semiconductor material for example silicon, so that no extraneous material need be deposited on the substrate. Moreover, the phase gratings can satisfactorily withstand the multitude of diffusion processes to which the substrate is to be subjected during the fabrication of integrated circuits.

When the I.C. pattern is imaged on the substrate the projection beam 18 which is supplied by a radiation source, not shown, only illuminates the I.C. pattern. The gratings $M_1$ and $M_2$ are not imaged, so that the I.C. designer need not make allowance for these gratings and no space has to be reserved for these gratings on each portion of the substrate on which one I.C. pattern is projected.

FIG. 1 shows the optical elements which are used in detecting deviations between the desired and the actual positions of the gratings relative to each other. Of the mechanical elements which serve for correctly positioning the mask and the substrate relative to each other only the turntable 55, on which the mask is disposed, and the turntable 56, on which the substrate is disposed are shown schematically. All optical elements, except for the laser 1, are accommodated in a vertical projection column (not shown), which is movable in the Y-direction via a carriage drive. The turntable 56 is connected to a carriage 60 via a column 90, which carriage is movable in the X-direction. The manner in which and the means with which the carriages are driven are no object of the present invention and will not be discussed. The displacements of the carriages in the X and Y directions can be measured accurately with the aid of an interferometer arrangement which will be described briefly with reference to FIG. 10.

The table for the mask is provided with stops (not shown), between which the mask is arranged, so that the mask is coarsely positioned. Subsequently, the angular position of the mask relative to the directions in which the carriage 56 is movable is to be adjusted. For this purpose an image of the grating $M_1$ is formed on the grating $M_2$. The mask is rotated until the image of the grating $M_1$ is in alignment with the grating $M_2$. The optical elements which form the image have been selected so that if alignment is obtained, the line which connects the centers of the gratings $M_1$ and $M_2$ is parallel to the direction X in which the carriage 60 is movable.

Subsequently, the substrate grating $P_2$ is aligned relative to the grating $M_2$ by displacement in the X and the Y-direction. The substrate is then moved in the X-direction over the known distance between the centres of $P_1$ and $P_2$. The substrate table 56 is then rotated about an axis (not shown), through the center of the grating $P_2$ until the grating lines of the grating $P_1$ which extend in the $\Phi$-direction (see FIG. 9) are in alignment with the corresponding grating lines in the grating $M_2$. If necessary, the steps described for the alignment of the substrate relative to the mask may be repeated. However, in most cases it suffices to carry out the steps only once.

After this alignment the radiation beam 18 can form a first image of the I.C. pattern 17 on the substrate with the aid of the system of projection lenses $L_1$, $L_2$, $L_3$. In between the consecutive projections the substrate can be moved over very accurately defined distances, for example within 0.05 $\mu$m, in the X and the Y direction, alignment being no longer necessary.

In the arrangement of FIG. 1 the radiation beam b which is emitted by a radiation source 1, for example a laser, is reflected to a movable prism 4 via the prisms 2 and 3. If the prism 4 is disposed in the path of the beam b, the beam is reflected to the substrate 8 by this prism and the prism 7. The lenses $L_2$ and $L_1$ focus the beam to a small radiation spot, for example with a diameter of 1 mm, on the grating $P_2$. This grating $P_2$ is a two-dimensional diffraction grating with rulings in the $\Phi$ and $\eta$-directions. (see FIG. 6). The grating $P_2$ reflects the incident beam so that a number of sub-beams of different diffraction orders are obtained, inter alia the sub-beams $b(+1, 0)$ and $b(-1, 0)$ in the $\Phi$-direction and the sub-beams $b(0, +1)$ and $b(0, -1)$ in the $\eta$-direction. The lenses $L_1$ and $L_2$ focus these sub-beams at different positions in the back-focal plane of the lens system $L_1$, $L_2$. In the back focal plane a diaphragm 9 is arranged. This diaphragm has four apertures and only transmits the first-order sub-beams. The sub-beams traverse the dividing prisms 6 and first-order images of the phase grating $P_2$ are formed on the grating $M_2$. Since only the first-orders are utilized, the period of the grating image is half that of the phase grating itself, when neglecting the magnification by the lens system $L_2$, $L_1$, $L_3$. As a result, the accuracy with which the gratings are aligned for a specific period of the grating $P_2$ is twice as high as in the case that the zero-order sub-beams were also used.

Figure 2:
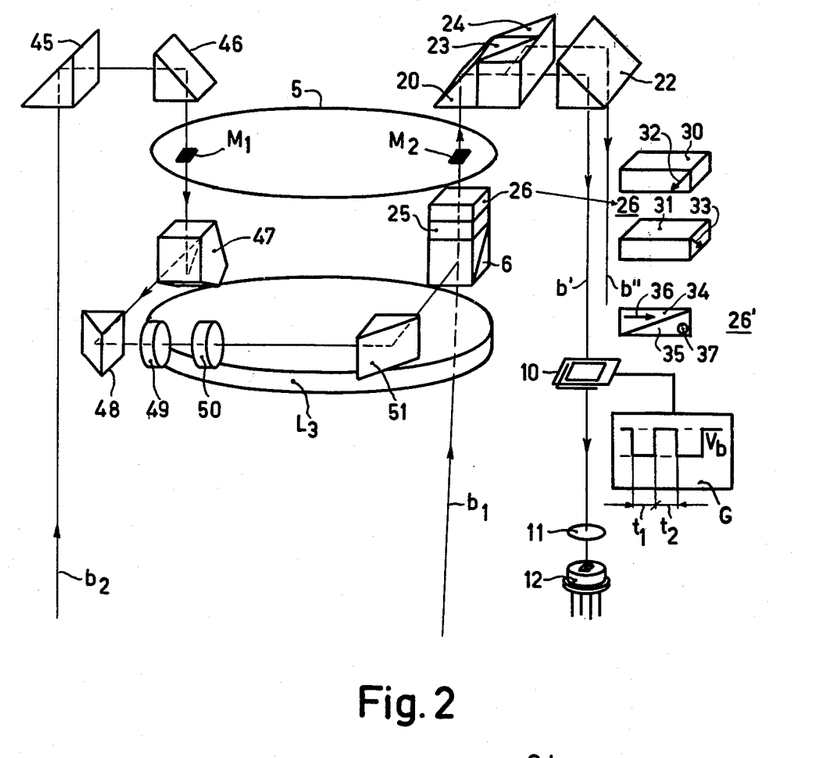

FIG. 2 shows the part of the arrangement above the line a-a' of FIG. 1 in more detail. The sub-beams $b(+1, 0)$, $b(-1, 0)$, $b(0, +1)$ and $b(0, -1)$ are represented by a single beam $b_1$ for the sake of simplicity. After the passage through the dividing prism 6 and the grating $M_2$ the beam $b_1$ is reflected to a radiation-sensitive detector 12 via the prisms 20 and 22.

In accordance with the invention the position of the image of the phase grating $P_2$ in the plane of the grating $M_2$ is modulated. Thus, the alignment can be observed dynamically which substantially improves the accuracy. Moreover, the influence of drift in the electronic circuit which processes the detection signal is then negligible. For this purpose the dividing prism 6 in the embodiment of FIGS. 1 and 2 takes the form of a polarization-sensitive dividing prism, which only transmits radiation with a specific direction of polarization. The laser 1 produces linearly polarized radiation. The dividing prism 6 is followed by a $\lambda/2$ plate 25 and a Savart-plate 26. As is shown in the right-hand part of FIG. 2 the Savart-plate comprises two plane-parallel quartz plates 30 and 31 of equal thickness, whose optic axes 32 and 33 make an angle of 45° with the plane-parallel surfaces and cross each other. The $\lambda/2$ plate 25 ensures that the direction of polarization of the beam $b_1$ makes an angle of 45° with the optic axes of the Savart plate. The beam $b_1$ which is incident at the plane-parallel faces of the Savart plate is divided into an ordinary beam and an extraordinary beam in the first quartz plate 31, which are converted into an extraordinary and an ordinary beam respectively at the plane of separation of the first and the second quartz plate respectively. This is because the optic axes of the two plates are perpendicular to each other. Two subbeams which are polarized at right angles to each other emerge from the Savart plate 26 which beams are shifted relative to each other. For the sake of clarity the subbeams are not shown separately in FIG. 2.

A polarization modulator 10 and an analyser 1 are arranged before the radiation-sensitive detector 12. The modulator is controlled by a squarewave voltage $V_b$ which is supplied by a generator G. As a result of this, the direction of polarization of the radiation beam which traverses the modulator is alternated through 90°. The direction of transmission of the analyser is parallel to one of the directions of polarization of the ordinary and extraordinary beams emerging from the Savart-plate. Thus, at any instant either the ordinary or the extraordinary beam will be transmitted to the detector. At a specific instant this detector "views" either an ordinary image of the grating $P_2$ formed by the ordinary beam or an extraordinary image of this grating formed by the extraordinary beam, the ordinary and the extraordinary image being superimposed with the grating $M_2$. The indices of refraction of the Savart plate and the thicknesses of the constituent plane-parallel plates have been selected so that the ordinary and the extraordinary image are shifted relative to each other by half a period of the grating. If the grating $M_2$ is disposed exactly between the ordinary and the extraordinary image of the grating $P_2$ (or $P_1$), the intensity of the radiation received by the detector 12 will be constant as a function of time.

Figure 3A:
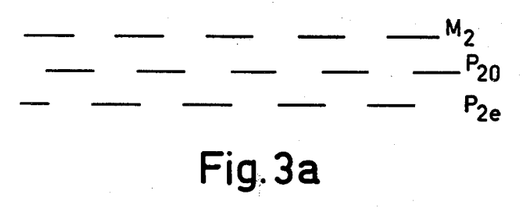
FIGS. 3a, 3b, 4a and 4b illustrate the operation of some components of this arrangement.
Figure 3B:
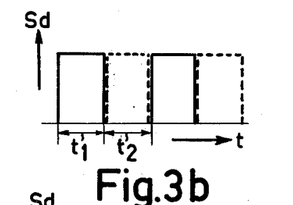

FIG. 3a shows this situation for one direction of the grating lines. The lines of the grating $M_2$, of the ordinary image $P_{2,o}$ and of the extraordinary image $P_{2,e}$ of the grating $P_2$ are normal to the plane of drawing. During a time interval ($t_1$) the detector receives the radiation intensity transmitted by $P_{2,o}$ and $M_2$ (see FIG. 31 and during a subsequent time interval ($t_2$) the radiation intensities are equal, so that the detector signal $S_d$ remains constant as a function of time.

Figure 4A:
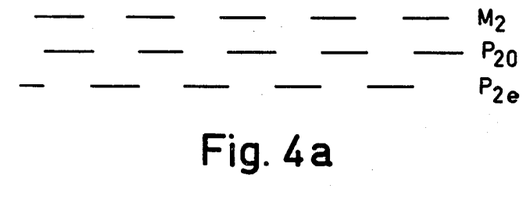
Figure 4B:
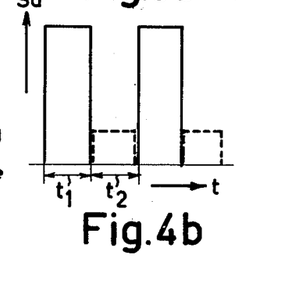

In the grating $M_2$ is not disposed exactly between $P_{2,o}$ and $P_{2,e}$, see FIG. 4a, the detector signal will not be constant as a function of time, as is shown in FIG. 4b. The differences in the signal $S_d$ can be detected very accurately. As a result, it is possible to align the grating lines of the grating $P_2$ (or $P_1$) very accurately, for example within 1/200 of the period of this grating, relative to those of the grating $M_2$.

In the situation of FIG. 4b, in which the grating $M_2$ is shifted to the right relative to the desired position, the detector signal in the time interval $t_1$ is greater than the detector signal in the time interval $t_2$. If the grating $M_2$ were shifted to the left relative to the desired position, the detector signal is the time interval $t_1$ will be smaller than in the time interval $t_2$. The signal from the generator G is also applied to an electronic circuit 57, in which the detector signal is processed. By comparing in which of the time intervals $t_1$ and $t_2$ the detector signal is greater, the direction of a positional error of the grating $P_2$ relative to the grating $M_2$ can be detected.

Figure 5:
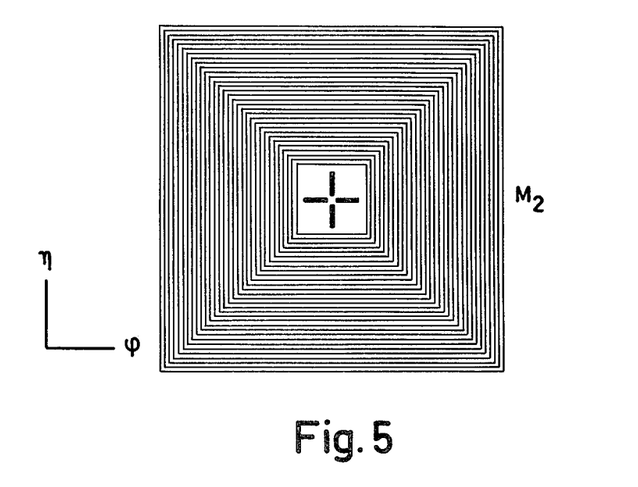
FIGS. 5, 6 and 9 show examples of gratings to be used in this arrangement.
Figure 6:
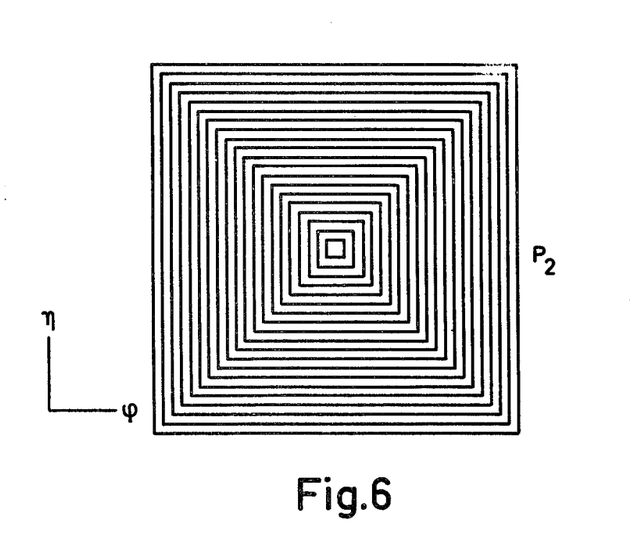
Figure 7:
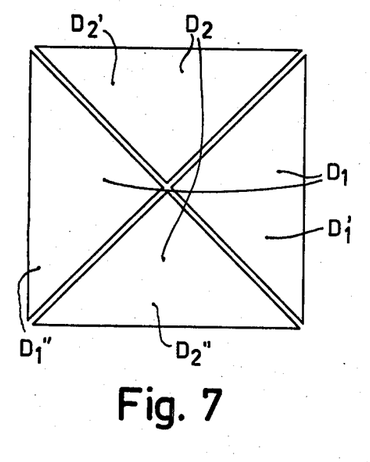
FIG. 7 shows a composite radiation-sensitive detector for use in the arrangement in accordance with the invention.

The gratings $M_2$ and $P_2$ are two-dimensional gratings, i.e. they consist of component gratings whose grating lines extend in the $\Phi$ and the $\eta$ direction. In FIGS. 5 and 6 examples of these gratings are shown, while FIG. 7 shows an example of a detector 12. The detector has a square shape and its sides are effectively parallel to the $\Phi$ and $\eta$ directions of the grating lines, i.e. when the gratings are correctly aligned the detector sides are effectively parallel to the $\Phi$ and the $\eta$ direction and when the gratings are not yet correctly aligned the detector sides make a small angle with the $\Phi$ and $\eta$ directions. The detector consists of two detectors $D_1$ and $D_2$, one of them each time being associated with the component gratings of the gratings $M_2$ and $P_2$. By means of the detector section $D_1$ it is possible to detect whether the mask and the substrate are correctly aligned in the $\eta$ direction of the gratings, and thus in the Y-direction of the projection machine; with the detector section $D_2$ it is possible to ascertain whether the alignment is correct in the $\Phi$ direction of the gratings and thus, in the X-direction of the projection machine. The detector may consist of four sections $D_1'$, $D_1''$, $D_2'$ and $D_2''$, the sections $D_1'$ and $D_1''$ as well as the sections $D_2'$ and $D_2''$ being interconnected.

After the grating $P_2$ has been aligned, the carriage 60 is moved in the X-direction over an accurately distance until the grating $P_1$ is disposed underneath the grating $M_2$. Subsequently, the grating $P_1$ is aligned relative to $M_2$ in a similar way as described for the grating $P_2$. In that case only the position in the Y-direction of the grating $P_1$ need be adjusted by rotation of the substrate table 56. For the grating $P_1$ it therefore suffices that it has grating lines which extend in the $\Phi$ direction. However, there is no objection against making the grating $P_1$ identical to the grating $P_2$ and using only the grating lines of the grating $P_1$ which extend in the $\Phi$ direction.

In a realized embodiment of an arrangement in accordance with the invention, in which the substrate was repeatedly exposed to a reduced image of the same I.C. pattern, the period of the grating $M_2$ was 48 $\mu$m and that of the gratings $P_2$ and $P_1$ approximately 19.5 $\mu$m The magnification of the system of projection lenses was approximately $5\times$. The distance between the chief rays of the ordinary and extraordinary beams emerging from the Savart plate was approximately 25 $\mu$m both in the X-direction and in the Y-direction. Thus a correctly reproducible alignment accuracy of approximately 0.1 $\mu$m could be achieved. It is to be noted that the grating $M_2$ in FIG. 5 is shown 20× enlarged and the grating $P_2$ in FIG. 6 100×.

The output signals from the sub-detectors are applied to an electronic circuit 57 in which, in a manner known per se, control signals are derived for correcting the positions of the grating $P_2$ and $P_1$ in the X-direction and the Y-direction, as is a schematically represented in FIG. 1 by the connection 58.

The method and arrangement described so far only allows detection of whether the strips of the gratings $M_2$ and $P_2$ (or $P_1$) are correctly aligned. However, it might occur that the gratings $M_2$ and $P_2$ (or $P_1$) are shifted relative to each other by exactly one grating period. In order to ascertain this, in accordance with the invention, a part of the radiation which passes through the grating $M_2$ is utilized to display the centers of the gratings $M_2$ and $P_2$ for the operator, so that the operator can ascertain whether the centers coincide. If the centres do not coincide the operator may for example depress a button so that the servo-system caused by substrate to be moved in the desired direction over exactly one grating period.

As can be seen in FIG. 2, the arrangement in accordance with the invention includes a semitransparent prism 23 which divides the beam which traverses the mask into two beams b' and b''. The beam b' is reflected to the detector by prism 22. The beam b'' is passed to a TV monitor 16 (FIG. 1) which is provided with a camera tube, by the prism 24 and 22 of FIG. 2 and the further prisms 13, 14 and 15 of FIG. 1. On the monitor images are displayed of the centers of the gratings $M_2$ and $P_2$ (or $P_1$).

Instead of a Savart plate 26 it is alternatively possible to employ a Wollaston prism 26'. As can be seen in the right-hand part of FIG. 2, such a prism consists of two congruent component prisms 34 and 35 of unaxial double refracting crystals which are assembled to a plane-parallel plate. The optic axis 36 is parallel to the plane of drawing and the optic axis 37 is normal to the plane of drawing. The radiation beam which is incident on one of the plane-parallel major faces of the prism 26' is split into two sub-beams by the prism, which subbeams are polarized at the right angles to each other and make a small angle with each other. By a suitable choice of the parameters of the prism 26' it is possible to ensure that the images of the grating $P_2$ formed at the location of the grating $M_2$ by the sub-beams are shifted by half a grating period.

Figure 8:
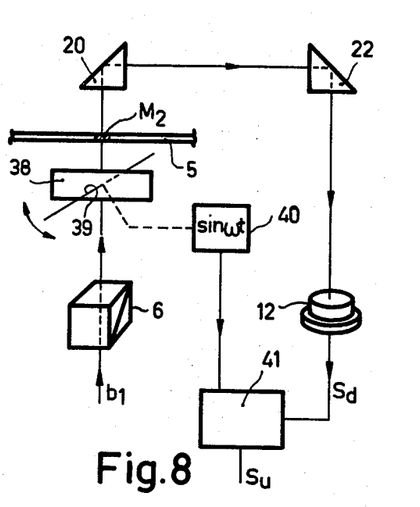
FIG. 8 shows a different embodiment of a part of the arrangement, and FIG. 10 schematically shows a set-up for measuring the displacements of the X and Y-carriage.

Instead of with a polarization-sensitive beam splitter and a polarization switch, alignment errors can also be detected dynamically if an image of the grating $P_2$ (or $P_1$) is continuously moved over the grating $M_2$. For this purpose a linearly movable optical wedge or a rotatable plane-parallel plate may be included in the radiation path instead of the elements 25 and 26 in FIG. 2. In FIG. 8 the last-mentioned plate is designated 38. In this Figure only a part of the radiation path of FIG. 2 is shown. The polarization switch and the analyser of FIG. 2 are no longer present in the arrangement of FIG. 8. The plane-parallel glass plate 38 of FIG. 8 can oscillate about its axis 39, which for alignment in the X- and Y-directions is disposed at 45° with these directions. Thus, the image of the grating $P_2$ is moved to and from over the grating $M_2$. The oscillation is obtained with the aid of a generator 40 and drive means, not shown. If the generator produces a signal $c \sin \omega t$, the signals $S_d$ of the detector 12 is: $d \sin (2\omega t + \theta)$. The phase of the detector signal is compared with the phase of the generator $4\theta$ in the electronic circuit 41. If $\theta$ has a specified value $\theta_o$, the correct adjustment of the grating $P_2$ (or $P_1$) relative to the grating $M_2$ is obtained. The output signal $S_u$ of the circuit 41 is again applied to the drive means for the X and Y carriages.

The use of a polarization switch in comparison with a mechanically moved transparent element, has the advantage that the zero point of the measurement cannot change owing to for example mechanical wear. Furthermore, if a polarization switch is used, the rate with which the position of an image of a grating is switched can be greater than the speed with which the image can be moved with mechanical means.

In order to enable the mask and the substrate to be aligned with the desired accuracy using the method and the arrangement described above, no magnification errors should occur during imaging of the substrate gratings. The projection system which serves to image the I.C. pattern on the substrate, should have a comparatively large image field, for example with a diameter of approximately 12 mm. The alignment gratings are located at the periphery of the image field of this lens system, so that the image of the substrate gratings on the grating $M_2$ is very susceptible to magnification errors. In order to avoid magnification errors, the distance between the substrate and the lens system and the distance between the mask and the lens system would have to be maintained highly constant and the substrate would have to be very flat. However, in practice the flatness error of the substrate is already approximately 5 μm, so that without further steps magnification errors might occur.

In accordance with the invention magnification errors are substantially avoided if the lens system is telecentric. As is shown in FIG. 1, the system of projection lenses comprises three lenses $L_1$, $L_2$, $L_3$. The lens $L_1$ is vertically movable, the lens floating for example on an air cushion formed between the lens and the substrate. Thus, the distance between the substrate and the lens $L_1$ can be maintained constant, also if the plane of the substrate is not perpendicular to the optical axis of the system of projection lenses or if flatness errors occur in the substrate. Each radiation beam coming from an arbitrary point on the substrate grating traverses the path between lenses $L_1$ and $L_2$ as a parallel beam. The lens $L_2$ is rigidly connected to the projection column. The lens $L_3$ makes the system of projectionlenses telecentric at the side of the mask, i.e. this lens ensures that the chief ray of any radiation beam which traverses the lens $L_2$ is normally incident on the plane of the mask. A vertical movement of the mask can then no longer give rise to a magnification error. As a result of this, the vertical tolerance at the side of the mask increased to for example 25 μm. Without the lens $L_3$ the axial position of the mask would have to be accurate within for example 5 μm.

The alignment of the substrate relative to the mask has been above. However, before this is possible the mask itself must be aligned. For this purpose, the prism 4 in the arrangement of FIGS. 1 and 2 is moved out of the path of the beam supplied by the source. The radiation beam $b_2$ is reflected by the prisms 45 and 46 so as to illuminate the grating $M_1$. The beam $b_2$ is subsequently reflected to the grating $M_2$ by the prism 47, 48 and 51 and the dividing prism 6. The radiation path of the beam $b_2$ furthermore includes two lenses 49 and 50. These lenses, in conjunction with the prisms 47, 48, 51 and 6, ensure that the grating M is imaged at full size on the grating $M_2$. The 1-to-1 imaging system is adapted so that the position of the image of $M_1$ only depends on the direction of the line which connects the center of the gratings $M_1$ and $M_2$, relative to the X-direction. By rotating the table 55 it is possible to align the gratings $M_1$ and $M_2$. The line which connects the center of the gratings $M_1$ and $M_2$ is then parallel to the direction of movement of the carriage 60.

Figure 9:
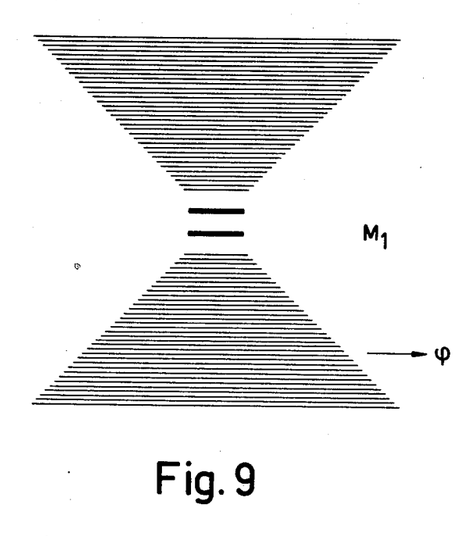

The mask $M_1$ for example has the shape shown in FIG. 9, the grating period being equal to that of the grating $M_2$. After passage through the grating $M_2$ the beam $b_2$ traverses the same elements as beam $b_1$.

By ensuring that the centers of the gratings $M_2$ and $M_1$ remain visible on the TV monitor the operator can adjust the mask in the X and Y direction with an accuracy up to for example 100 $\mu$m. The periodic signals supplied by the detector 12 when the beam $b_2$ traverses the alignment system, and which consequently can only provide an indication of a possible deviation between the desired and the actual direction of the line which connects the centers of the grating $M_1$ and $M_2$, are again applied to an electronic processing circuit 57 whose output is connected to means, not shown, for rotating the table 55, schematically represented by the connection 59.

Figure 10:
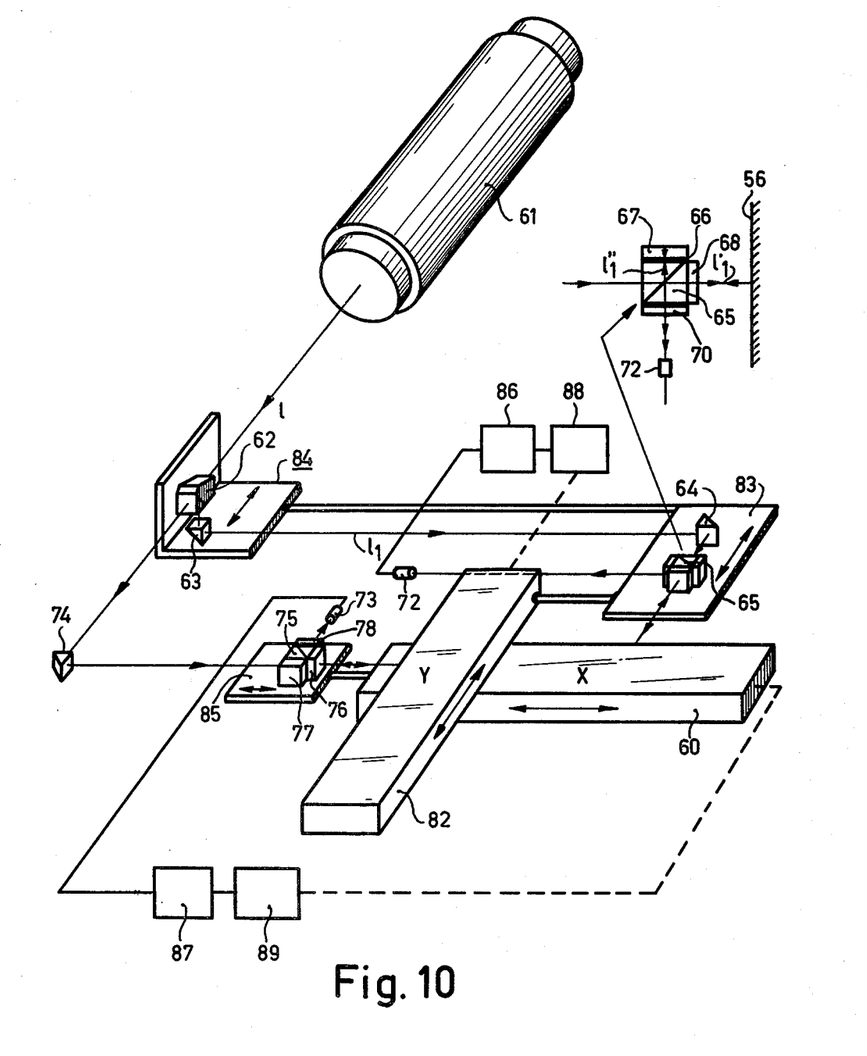

FIG. 10 schematically shows the arrangement by means of which the movements of the X-carriage, on which the substrate is disposed, and of the Y-carriage, which is rigidly connected to the vertical projection column, can be measured. This arrangement is based on the principle of the laser interferometer which is described in "Philips Technical Review" 30, No. 6/7, pages 160–165. The known arrangement has been adapted so that both the displacement of the X-carriage and the Y-carriage can be measured with the aid of one laser. A beam splitter 62 splits the laser beam 1 into a subbeam $1_1$ for measuring the displacement of the Y-carriage and a subbeam $1_2$ for measuring the displacement of the X-carriage. The beam $1_1$ is reflected to a polarization-sensitive beam splitter 65 by the prisms 63 and 64. This beam splitter is secured to a plate 83 which is rigidly connected to the Y-carriage 82 and rigidly connected to a frame on which the beam splitter 62 and the prism 63 are mounted. A movement of the Y-carriage then means a variation in the distance between the beam splitter 65 and the side of the X-carriage. In the top-right corner of FIG. 10 the beam splitter 65 and the elements arranged around it are shown slightly enlarged. These elements are a $\lambda/4$ plate 66, a reference mirror 67, a $\lambda/4$ plate 68, and an analyser 70. For further details of the measuring method reference is made to the article in the "Philips Technical Review" 30, No. 6/7.

The beam $1_2$ which emerges from the beam splitter 62 is reflector to a polarization-sensitive beam splitter 75 by a prism 74. The elements 76, 77 and 78 which are arranged around said beam splitter have the same functions as the elements 68, 67 and 70. The beam splitter 75 is arranged on a plate 85 which is rigidly connected to the X-carriage. A movement of the X-carriage means a variation in the distance between the beam splitter 74 and the reflecting side of the Y-carriage. The sub-beams reflected by the Y-carriage and the reference mirror 77 are intercepted by a detector 73. The detectors 73 and 72 are connected to electronic circuits 86 and 87.

In the circuits 86 and 87 the number of pulses counted, which is a measure of the displacement, can be compared with a reference number for moving the carriages over a specific distance. The outputs of the electronic circuits 86 and 87 are connected to drive means 87 and 88 for the X and Y carriages, so that these carriages are stopped when a specific number of pulses has been counted.

The invention has been described with reference to the projection of an IC pattern on a semiconductor substrate. It is obvious that the arrangement described hereinbefore may also be used for other lithographic techniques where a plurality of masks must be consecutively projected on a substrate and very accuratel positioned relative to the substrate. In this respect the fabrication of transport patterns and detection patterns for magnetic domain stores may be mentioned. In the above description "IC pattern" should then read: "transport pattern" or "detection pattern" and "I.C. substrate" should read "layer of magnetizable material".

What is claimed is:

1. A method of aligning with a substrate a mask pattern formed in a mask, wherein the mask pattern is repeatedly imaged directly on said substrate, comprising the steps of: (a) providing said mask comprising plural gratings which are located in said mask outside the area of said mask pattern, (b) providing said substrate comprising two phase gratings which are located outside the area on said substrate where a plurality of images of said mask pattern are to be formed, (c) using a first of said mask gratings as a reference with which other gratings are aligned, (d) imaging a said phase grating on said reference grating with a projection system which is used for imaging said mask pattern on said substrate, (e) modulating the position of an observed image of a certain said grating which is momentarily aligned relative to said reference grating, and (f) adjusting the position of said certain grating so that, averaged in time, the observed image of said certain grating is aligned relative to the reference grating.

2. A method as claimed in claim 1, wherein the image of a second said mask grating comprises lines extending in a first direction, comprising the steps of rotating said mask about an axis perpendicular to the plane thereof to align the lines of said second mask grating relative to the corresponding lines of said first mask grating, subsequently aligning grating lines of a first said substrate grating, which lines extend in two mutually perpendicular directions, relative to the corresponding grating lines of said first mask grating then moving said substrate in the direction of the line which connects the center of the first and the second mutually aligned gratings in the mask over a distance equal to the distance between said two substrate gratings, and then rotating said substrate about an axis which extends substantially through the center of the first substrate grating, to align the grating lines of the second substrate grating relative to the corresponding grating lines of the first grating in the mask.

3. An arrangement for carrying out the method in accordance with claim 1, comprising a radiation source which supplies an alignment beam, a lens system for imaging one of said substrate gratings on a first said mask grating, and a radiation-sensitive detector which is disposed in the path of said alignment beam beyond said mask, said lens system comprising said projection system utilized for imaging said mask pattern on said substrate, and, further comprising, in the path of said alignment beam between the system of projection lenses and said detector optical elements which are controlled by periodic signals for periodically moving the image of a said substrate grating observed by the detector and formed in the plane of said mask, the displacement of the observed image being of the order of magnitude of the period of said first mask.

4. An arrangement as in claim 3, comprising a diaphragm in the path of the alignment beam between said projection system and said mask, said diaphragm transmitting only the first order sub-beams of the alignment beam diffracted by the substrate gratings to said mask.

5. An arrangement as in claim 3, wherein said projection system is a telecentric system and comprises three lens systems, of which systems only the lens system which is nearest said substrate is movable along optical axis.

6. An arrangement as in claim 3, comprising means for providing a first radiation path for each time imaging one of said substrate gratings on said first mask grating, which first radiation path extends from said radiation source to a beam splitter which is disposed underneath said first grating in the mask, said means comprising a radiation-reflecting element, which may be included in the path of the radiation emitted by the source, the projection system, a reflection at one of said substrate gratings, a second passage through said projection system, and said diaphragm, said arrangement further comprising means for providing a second radiation path for imaging said second grating in the mask on said first grating in the mask at full true size, the position of the image of said second mask grating depending only on the direction of the line which connects the centers of the first and the second mask gratings relative to the direction of movement of a carriage with which the substrate is moved, which second radiation path extends from the radiation source to said beam splitter via reflecting elements above the mask, through said second mask grating and via further reflecting elements underneath said mask, and a lens system, said beam splitter combining said two radiation paths to a common radiation path through said mask to the radiation-sensitive detector.

7. An arrangement as in claim 3, wherein said radiation source emits a linearly polarized beam of radiation, said optical elements for periodically moving the image of one of said substrate gratings and said second grating in the mask respectively, comprise a polarization-sensitive element which is disposed in the common radiation path before the mask, which polarization-sensitive element splits the alignment beam into two sub-beams with mutually perpendicular directions of polarization, said sub-beams forming the images of said second mask grating and one of said substrate gratings respectively at the location of said first mask grating, which images are mutually shifted by one half period of the first mask grating by a polarization switch and by an analyzer, said polarization switch being disposed in the common radiation path before the detector and controlled by a squarewave voltage, said polarization switch switching the directions of polarization of the sub-beams through 90°, said analyzer being located between the polarization switch and the detector, the control voltage for the polarization switch also being applied to an electronic circuit in which the detector signal is processed to a control signal for correcting the grating position.

8. An arrangement as in claim 3, wherein there is disposed at the common radiation path between the beam splitter and the mask a movable transparent element which moves the image of the second mask grating or one of the substrate gratings respectively to and fro over the first mask grating, the output of the detector being connected to an electronic circuit in which the detector signal is processed to a control signal for correcting the grating position, there being applied to the circuit also a signal which is proportional to the driving signal for the movable element.

9. An arrangement as in claim 3, comprising a second beam splitter that is disposed in the common radiation path behind the mask and which produces two beams, one of which beams is aimed at the detector and the second at a camera tube which is coupled with a TV monitor on which the gratings are monitored.

10. An arrangement as in claim 3, wherein the detector has a square shape and comprises at least two sub-detectors whose separating lines extend diagonally in the square, the straight sides of the square being effectively parallel to the two directions of the grating lines of the first mask grating.

* * * * *